(12) United States Patent
Ruben et al.

(10) Patent No.: US 11,406,004 B2
(45) Date of Patent: Aug. 2, 2022

(54) USE OF METAL-CORE PRINTED CIRCUIT BOARD (PCB) FOR GENERATION OF ULTRA-NARROW, HIGH-CURRENT PULSE DRIVER

(71) Applicant: LASERTEL, INC., Tucson, AZ (US)

(72) Inventors: Eric Paul Ruben, Tucson, AZ (US); Jean Michel Maillard, Tucson, AZ (US); Prabhu Thiagarajan, Tucson, AZ (US)

(73) Assignee: LEONARDO ELECTRONICS US INC., Tucson, AZ (US)

( * ) Notice: Subject to any disclaimer, the term of this patent is extended or adjusted under 35 U.S.C. 154(b) by 0 days.

(21) Appl. No.: 16/539,889

(22) Filed: Aug. 13, 2019

(65) Prior Publication Data
US 2020/0053865 A1 Feb. 13, 2020

Related U.S. Application Data

(60) Provisional application No. 62/718,249, filed on Aug. 13, 2018.

(51) Int. Cl.
*H05K 1/02* (2006.01)
*H03K 17/14* (2006.01)
(Continued)

(52) U.S. Cl.
CPC ......... *H05K 1/0204* (2013.01); *H03K 17/145* (2013.01); *H05K 1/0313* (2013.01);
(Continued)

(58) Field of Classification Search
CPC ........ H05K 1/0204; H05K 1/09; H05K 1/115;
H05K 1/0313; H05K 2201/10166; H05K 2201/066; H05K 1/0265; H05K 1/053; H05K 2201/0792; H05K 1/021; H05K 1/056; H05K 3/0061; H05K 1/0209; H05K 1/183; H05K 3/4652; H05K 2201/0209;
(Continued)

(56) References Cited

U.S. PATENT DOCUMENTS

| 3,711,939 A | 1/1973 | Stoll .............................. 228/246 |
| 3,805,375 A | 4/1974 | LaCombe et al. .............. 29/832 |

(Continued)

FOREIGN PATENT DOCUMENTS

| CA | 2 208 370 C | 7/2005 |
| DE | 968430 | 2/1958 |

(Continued)

OTHER PUBLICATIONS

Sunstone, FR-4 PCB Material, Mar. 14, 2017 (Year: 2017).*
(Continued)

*Primary Examiner* — Steven T Sawyer
(74) *Attorney, Agent, or Firm* — Hayes Soloway P.C.

(57) ABSTRACT

A metal-core printed circuit board (MCPCB) and method of generating an ultra-narrow, high-current pulse driver with a MCPCB is provided. The MCPCB includes a rigid, metal heat sink layer and at least one electrically conductive top layer. At least one electrically insulating dielectric layer is positioned between the conductive top layer and rigid, metal heat sink layer, wherein the dielectric layer has a thickness of less than 0.007 inches.

13 Claims, 5 Drawing Sheets

(51) Int. Cl.
*H05K 1/09* (2006.01)
*H05K 1/11* (2006.01)
*H05K 1/03* (2006.01)

(52) U.S. Cl.
CPC .............. *H05K 1/09* (2013.01); *H05K 1/115* (2013.01); *H05K 2201/066* (2013.01); *H05K 2201/10166* (2013.01)

(58) Field of Classification Search
CPC ......... H05K 3/305; H05K 2201/09781; H05K 1/182; H03K 17/145; H01L 23/142; H01L 2924/13091; H01L 2224/48227; H01L 2224/45144; H01L 2224/48472; H01L 2224/45124; H01L 2224/48091; H01L 2924/3025
See application file for complete search history.

(56) References Cited

U.S. PATENT DOCUMENTS

| | | | |
|---|---|---|---|
| 3,936,322 A | 2/1976 | Blum et al. | 148/1.5 |
| 4,092,614 A | 5/1978 | Sakuma et al. | |
| 4,156,879 A | 5/1979 | Lee | 357/22 |
| 4,306,278 A | 12/1981 | Fulton et al. | 362/259 |
| 4,653,056 A | 3/1987 | Baer et al. | |
| 4,767,674 A * | 8/1988 | Shirai | B32B 15/08 |
| | | | 257/E23.006 |
| 4,803,691 A | 2/1989 | Scifres et al. | 372/150 |
| 4,813,762 A | 3/1989 | Leger | H01S 5/4062 |
| 4,881,237 A | 11/1989 | Donnelly | |
| 4,903,274 A | 2/1990 | Taneya et al. | |
| 4,947,401 A | 8/1990 | Hinata et al. | |
| 4,980,893 A | 12/1990 | Thornton et al. | |
| 4,993,148 A * | 2/1991 | Adachi | H05K 1/021 |
| | | | 174/252 |
| 5,008,737 A | 4/1991 | Burnham et al. | 357/81 |
| 5,031,187 A | 7/1991 | Orenstein et al. | |
| 5,040,187 A | 8/1991 | Karpinski | |
| 5,045,972 A | 9/1991 | Supan | C22C 26/00 |
| 5,060,237 A | 10/1991 | Peterson | |
| 5,061,974 A | 10/1991 | Onodera et al. | |
| 5,099,488 A | 3/1992 | Ahrabi et al. | |
| 5,102,825 A | 4/1992 | Brennan et al. | 437/129 |
| 5,105,429 A | 4/1992 | Mundinger et al. | |
| 5,105,430 A | 4/1992 | Mundinger et al. | |
| 5,128,951 A | 7/1992 | Karpinski | |
| 5,202,706 A | 4/1993 | Hasegawa | 359/819 |
| 5,212,706 A | 5/1993 | Jain | |
| 5,212,707 A | 5/1993 | Heidel et al. | |
| 5,253,260 A | 10/1993 | Palombo | 372/34 |
| 5,284,790 A | 2/1994 | Karpinski | |
| 5,298,762 A | 3/1994 | Ou | 257/13 |
| 5,305,344 A | 4/1994 | Patel | |
| 5,311,530 A | 5/1994 | Wagner et al. | 372/36 |
| 5,311,535 A | 5/1994 | Karpinski | |
| 5,325,384 A | 6/1994 | Herb et al. | |
| 5,394,426 A | 2/1995 | Joslin | |
| 5,418,799 A | 5/1995 | Tada | |
| 5,440,577 A | 8/1995 | Tucker | |
| 5,450,430 A | 9/1995 | Chung | 372/38 |
| 5,455,738 A | 10/1995 | Montesano et al. | 361/707 |
| 5,497,391 A | 3/1996 | Paoli | |
| 5,504,767 A | 4/1996 | Jamison et al. | |
| 5,521,931 A | 5/1996 | Biegelsen et al. | |
| 5,526,373 A | 6/1996 | Karpinski | |
| 5,568,498 A | 10/1996 | Nilsson | |
| 5,593,815 A | 1/1997 | Ahn | 430/321 |
| 5,627,850 A | 5/1997 | Irwin et al. | |
| 5,644,586 A | 7/1997 | Kawano et al. | |
| 5,679,963 A | 10/1997 | Klem et al. | 257/46 |
| 5,764,675 A | 6/1998 | Juhala | |
| 5,778,020 A | 7/1998 | Gokay | |
| 5,783,316 A | 7/1998 | Colella et al. | |
| 5,812,573 A | 9/1998 | Shiomi et al. | |
| 5,835,515 A | 11/1998 | Huang | |
| 5,835,518 A | 11/1998 | Mundinger et al. | 372/50 |
| 5,848,083 A | 12/1998 | Haden et al. | 372/36 |
| 5,856,990 A | 1/1999 | Nilsson | 359/344 |
| 5,909,458 A | 6/1999 | Freitas et al. | 372/36 |
| 5,913,108 A | 6/1999 | Stephens et al. | |
| 5,923,692 A | 7/1999 | Staskus et al. | |
| 5,930,279 A | 7/1999 | Apollonov et al. | 372/50 |
| 5,987,045 A | 11/1999 | Albares et al. | 372/38 |
| 6,031,285 A | 2/2000 | Nishibayashi | |
| 6,101,208 A | 8/2000 | Gokay | |
| 6,208,677 B1 | 3/2001 | Moyer | 372/66 |
| 6,252,179 B1 * | 6/2001 | Lauffer | H05K 1/0206 |
| | | | 174/255 |
| 6,281,471 B1 | 8/2001 | Smart | 219/121.62 |
| 6,295,307 B1 | 9/2001 | Hoden et al. | 372/36 |
| 6,352,873 B1 | 3/2002 | Hoden | 438/28 |
| 6,396,857 B1 | 5/2002 | Labranche | |
| 6,424,667 B1 | 7/2002 | Endriz et al. | |
| 6,480,514 B1 | 11/2002 | Lorenzen et al. | 372/35 |
| 6,493,373 B1 | 12/2002 | Boucart | 257/33.069 |
| 6,535,533 B2 | 3/2003 | Lorenzen et al. | 372/34 |
| 6,535,541 B1 | 3/2003 | Boucart et al. | 372/96 |
| 6,542,531 B2 | 4/2003 | Sirbu | B82Y 20/00 |
| 6,727,117 B1 | 4/2004 | McCoy | |
| 6,865,200 B2 | 3/2005 | Takigawa et al. | |
| 7,016,383 B2 | 3/2006 | Rice | |
| 7,286,359 B2 | 10/2007 | Khbeis et al. | |
| 7,359,413 B2 | 4/2008 | Tzuk et al. | 372/34 |
| 7,529,286 B2 | 5/2009 | Gokay et al. | 372/69 |
| 7,580,189 B2 | 8/2009 | Urey | G02B 3/0062 |
| 7,660,335 B2 | 2/2010 | Thiagarajan et al. | 372/34 |
| 7,864,825 B2 | 1/2011 | Thiagarajan et al. | 372/36 |
| 7,944,955 B2 | 5/2011 | Thiagarajan et al. | 372/34 |
| 8,017,935 B2 | 9/2011 | Staszewski et al. | 257/27 |
| 8,653,550 B2 | 2/2014 | Mastro | H01L 33/40 |
| 8,664,524 B2 | 3/2014 | Garnett | H01L 31/02966 |
| 8,848,753 B2 | 9/2014 | Koenning | 372/29.021 |
| 9,256,073 B2 | 2/2016 | Chann | G02B 5/18 |
| 10,120,149 B1 | 11/2018 | Mathai | G02B 6/425 |
| 2001/0017870 A1 | 8/2001 | Hayakawa | 372/40 |
| 2002/0001864 A1 | 1/2002 | Ishikawa et al. | |
| 2002/0009106 A1 | 1/2002 | Miyokawa et al. | |
| 2002/0014631 A1 | 2/2002 | Iwata | 257/89 |
| 2002/0025096 A1 | 2/2002 | Wang et al. | 385/8 |
| 2002/0086483 A1 | 7/2002 | Kim | 438/264 |
| 2002/0086486 A1 | 7/2002 | Tanaka | H01L 21/28518 |
| 2003/0116767 A1 | 6/2003 | Kneissl et al. | 257/79 |
| 2004/0037340 A1 | 2/2004 | Yanagisawa | |
| 2004/0052280 A1 | 3/2004 | Rice | |
| 2004/0082112 A1 | 4/2004 | Stephens | |
| 2004/0125459 A1 | 7/2004 | Tanitsu et al. | 359/619 |
| 2004/0264521 A1 | 12/2004 | Ness et al. | |
| 2005/0087849 A1 * | 4/2005 | Morita | H01L 24/48 |
| | | | 257/678 |
| 2005/0095755 A1 | 5/2005 | Nakata et al. | |
| 2005/0232628 A1 | 10/2005 | Von Freyhold et al. | 398/41 |
| 2005/0254539 A1 | 11/2005 | Klimek | |
| 2006/0011938 A1 | 1/2006 | Debray | 257/104 |
| 2006/0197100 A1 | 9/2006 | Shen | 257/94 |
| 2007/0116079 A1 | 5/2007 | Giniunas et al. | 372/69 |
| 2007/0273957 A1 | 11/2007 | Zalevsky | G02B 27/1093 |
| 2008/0089380 A1 | 4/2008 | Konig et al. | 372/75 |
| 2008/0123710 A1 | 5/2008 | Brick | B82Y 20/00 |
| 2008/0130223 A1 | 6/2008 | Nakamura | H02M 7/003 |
| 2008/0213710 A1 | 9/2008 | Schultz | F23N 1/027 |
| 2008/0259983 A1 | 10/2008 | Trococoli | 372/6 |
| 2009/0015185 A1 * | 1/2009 | Yoshida | H01L 24/49 |
| | | | 318/504 |
| 2009/0090932 A1 | 4/2009 | Bour et al. | 257/103 |
| 2010/0012188 A1 | 1/2010 | Garnett | 136/260 |
| 2011/0051759 A1 | 3/2011 | Telford | 372/35 |
| 2011/0103409 A1 | 5/2011 | Sipes | G02B 6/4296 |
| 2011/0241549 A1 | 10/2011 | Wootton | 315/117 |
| 2011/0280269 A1 | 11/2011 | Ghang-Hasnain | H01S 5/105 |
| 2012/0043875 A1 * | 2/2012 | Seo | H01L 23/3677 |
| | | | 313/45 |
| 2012/0114001 A1 | 5/2012 | Fang et al. | 372/45.01 |
| 2012/0153254 A1 | 6/2012 | Mastro | 257/13 |

(56) References Cited

U.S. PATENT DOCUMENTS

| | | | |
|---|---|---|---|
| 2012/0252144 A1 | 10/2012 | Schroeder et al. | 438/26 |
| 2012/0287958 A1 | 11/2012 | Lell | H01S 5/323 |
| 2013/0016752 A1 | 1/2013 | Lell | H01S 5/323 |
| 2013/0112667 A1 | 5/2013 | Holmgren | G02B 27/0961 |
| 2013/0259074 A1 | 10/2013 | Newman | H01S 3/04 |
| 2013/0271959 A1 | 10/2013 | Woodgate | G09F 13/04 |
| 2014/0084452 A1* | 3/2014 | Nagamatsu | H01L 21/561 257/734 |
| 2014/0293554 A1* | 10/2014 | Shashkov | C25D 13/02 361/748 |
| 2015/0063387 A1 | 3/2015 | Joseph et al. | H01S 5/02438 |
| 2015/0162478 A1 | 6/2015 | Fafard | 257/461 |
| 2015/0207011 A1 | 7/2015 | Garnett | H01L 31/0368 |
| 2015/0207294 A1 | 7/2015 | Brick et al. | H01S 5/10 |
| 2015/0255960 A1 | 9/2015 | Kanskar | H01S 5/4075 |
| 2016/0014878 A1* | 1/2016 | Kilhenny | H05K 3/0094 257/99 |
| 2016/0147025 A1 | 5/2016 | Sakamoto | G02B 27/0905 |
| 2016/0192473 A1* | 6/2016 | Kasashima | H05K 1/0204 174/251 |
| 2016/0366757 A1* | 12/2016 | Kobayashi | H05K 1/0204 |
| 2017/0051884 A1* | 2/2017 | Raring | H01S 5/02236 |
| 2017/0288367 A1 | 10/2017 | Taniguchi | |
| 2017/0338194 A1* | 11/2017 | Gittemeier | H01L 29/2003 |
| 2018/0152000 A1 | 5/2018 | Crawford et al. | H01S 5/02288 |
| 2018/0254606 A1 | 9/2018 | McElhinney et al. | H01S 5/02484 |
| 2018/0261975 A1* | 9/2018 | Pavlov | G01S 7/484 |
| 2018/0335582 A1 | 11/2018 | Ishige | |
| 2018/0337513 A1 | 11/2018 | Crawford et al. | H01S 5/3095 |
| 2020/0027839 A1* | 1/2020 | Hino | H01L 23/49 |
| 2020/0028332 A1 | 1/2020 | Kobayashi | G02B 3/06 |
| 2020/0075529 A1* | 3/2020 | Otsuka | H01L 24/84 |

FOREIGN PATENT DOCUMENTS

| | | | |
|---|---|---|---|
| DE | 19518177 | 11/1996 | H01S 3/0941 |
| DE | 10062579 | 6/2001 | |
| DE | 102008040374 | 1/2010 | H01S 5/40 |
| EP | 1439618 | 7/2004 | H01S 5/024 |
| EP | 1452614 | 9/2004 | H01S 5/024 |
| EP | 1811617 | 7/2007 | H01S 5/024 |
| EP | 1887666 | 2/2008 | H01S 5/024 |
| EP | 2110903 | 10/2009 | H01S 5/00 |
| EP | 2305400 | 4/2011 | B22D 19/00 |
| JP | 2002111058 | 4/2002 | H01L 33/00 |

OTHER PUBLICATIONS

Chen et al., High-T Polymer Dec. 25, 2017 (Year: 2017).*
RO30000 Series Laminates, Rogers Corporation Data sheet (Year: 2020).*
Polyimide properties data sheet, www.mit.edu, Oct. 27, 2004 (Year: 2004).*
International Search Report and Written Opinion for PCT International Patent Application Serial No. PCT/US19/46410, dated Nov. 8, 2019 (8 pages).
Chinese Official Action issued in related Chinese Patent Application Serial No. 201780073945.8, dated Sep. 21, 2020 (16 pages) with translation.
Official Action issued in Applicants' corresponding EPO Application Serial No. 07117048.7-2222, dated Aug. 6, 2009, 4 pages.
Official Action issued in Applicants' corresponding EPO Application Serial No. 07117048.7-2222, dated Nov. 20, 2008, 9 pages.
Intention to Grant issued in Applicants' corresponding EPO Application Serial No. 09157643.9, dated Apr. 7, 2017, 6 pages.
Official Action issued in Applicants' corresponding EPO Application Serial No. 09157643.9, dated Aug. 22, 2016, 5 pages.
Official Action issued in Applicants' corresponding EPO Application Serial No. 09157643.9, dated Apr. 16, 2014, 2 pages.
European Search Report issued in application No. 09157643.9, dated Aug. 9, 2013 (7 pgs).
European Search Report issued in application No. 20150730.8, dated Jul. 3, 2020 (8 pgs).
Intention to Grant issued in Applicants' corresponding EPO Application Serial No. 16172620.3, dated Jul. 19, 2019, 3 pages.
European Search Report issued in application No. 18173282.7-1211, dated Oct. 8, 2018 (8 pgs).
European Search Report issued in application No. 18173282.7-1211, dated May 20, 2021 (6 pgs).
Intention to Grant issued in Applicants' corresponding EPO Application Serial No. 06845311.7, dated Nov. 9, 2010, 5 pages.
European Search Report issued in application No. 06845311.7, dated Mar. 31, 2010 (9 pgs).
Official Action issued in European application No. 18173282.7-1211, dated Jan. 23, 2020 (6 pgs).
European Search Report issued in application No. 16172620.3, dated Oct. 25, 2016 (9 pgs).
European Supplemental Search Report issued in related European Patent Application 17875888.4, dated Jul. 9, 2020 (11 pages).
European Supplemental Search Report issued in related European Patent Application 20196466.5, dated Feb. 16, 2021 (7 pages).
Feng, et al., "High efficient GaN-based laser diodes with tunnel junction", Applied Physics Letters 103, AIP Publishing, LLC, 2013.
Rieprich, et al., "Proceedings of SPIE—Assessment of factors regulating the thermal lens profile and lateral brightness in high power diode lasers", SPIEL ASE, 2017.
Office Action issued in U.S. Appl. No. 15/363,874, dated Jul. 18, 2019 (24 pgs).
Office Action issued in U.S. Appl. No. 15/363,874, dated Apr. 24, 2018 (10 pgs).
Office Action issued in U.S. Appl. No. 15/363,874, dated Feb. 14, 2019 (13 pgs).
Office Action issued in U.S. Appl. No. 15/363,874, dated Mar. 6, 2020 (12 pgs).
Office Action issued in U.S. Appl. No. 15/363,874, dated Jun. 15, 2020 (12 pgs).
Office Action issued in U.S. Appl. No. 15/363,874, dated Oct. 14, 2020 (11 pgs).
Office Action issued in U.S. Appl. No. 15/363,874, dated Oct. 4, 2018 (14 pgs).
Notice of Allowance issued in U.S. Appl. No. 15/363,874, dated Feb. 2, 2021 (7 pgs).
Office Action issued in U.S. Appl. No. 14/728,923, dated Aug. 9, 2018 (17 pgs).
Office Action issued in U.S. Appl. No. 14/728,923, dated Apr. 19, 2018 (16 pgs).
Office Action issued in U.S. Appl. No. 14/728,923, dated Oct. 2, 2017 (11 pgs).
Office Action issued in U.S. Appl. No. 12/105,126, dated Jul. 23, 2009 (7 pgs).
Office Action issued in U.S. Appl. No. 12/105,126, dated Apr. 24, 2009 (8 pgs).
Notice of Allowance issued in U.S. Appl. No. 12/648,141, dated Sep. 22, 2009 (7 pgs).
Notice of Allowance issued in U.S. Appl. No. 12/648,141, dated Jan. 11, 2011 (11 pgs).
Office Action issued in U.S. Appl. No. 11/299,029, dated Aug. 22, 2008 (8 pgs).
Office Action issued in U.S. Appl. No. 16/540,961, dated Nov. 17, 2020 (13 pgs).
Office Action issued in U.S. Appl. No. 16/540,961, dated Aug. 5, 2020 (9 pgs).
Office Action issued in U.S. Appl. No. 11/829,030, dated Nov. 30, 2009 (16 pgs).
Office Action issued in U.S. Appl. No. 11/829,030, dated Jun. 24, 2009 (13 pgs).
Office Action issued in U.S. Appl. No. 11/829,630, dated Apr. 3, 2009 (13 pgs).
Office Action issued in U.S. Appl. No. 11/829,030, dated Nov. 12, 2008 (12 pgs).
Office Action issued in U.S. Appl. No. 16/895,961, dated Dec. 10, 2021 (39 pgs).
Notice of Allowance issued in U.S. Appl. No. 11/829,030, dated Aug. 30, 2010 (7 pgs).

(56) References Cited

OTHER PUBLICATIONS

Notice of Allowance issued in U.S. Appl. No. 16/734,133, dated Dec. 3, 2021 (9 pgs).
Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).
Martin et al., "Thermal Behavior of Visible AIGaInP-GaInP Ridge Laser Diodes" IEEE Journal of Quantum Electronics, vol. 28, No. 11, dated Nov. 1992 (7 pgs).
Monachon, C., "Thermal Boundary conductance Between Metals and Dielectrics" thesis for the graduation of Doctor of Science, Federal Institute of Technology in Lausanne, 2013 (251 pgs).
Nekorkin et al., "Nonlinear mode mixing in dual-wavelength semiconductor lasers with tunnel junctions", Applied Physics Letters 90, 171106 (2007) (3 pgs).
Notice of Allowance issued in U.S. Appl. No. 15/601,820, dated Jun. 11, 2019 (8 pgs).
Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).
Zhang et al., "Thermal Transport Across Metal-Insulator Interface Via Electron-Phonon Interaction," Journal of Physics Condensed Matter, dated Oct. 2013 (15 pgs).
International Preliminary Report on Patentability issued in application No. PCT/US2017/057209, dated Jun. 4, 2019 (8 pgs).
Intemnational Search Report and Written Opinion issued in corresponding PCT Patent Appln. Serial No. PCT/US17/57209 dated Jan. 16, 2018, 10 pgs.
Office Action issued in U.S. Appl. No. 15/601,820, dated Feb. 27, 2019 (26 pages).
Office Action issued in U.S. Appl. No. 15/601,820, dated Aug. 27, 2018 (28 pages).
Yonkee, B.P., et al., "Demonstration of a III-nitride edge-emitting laser diode utilizing a GaN tunnel junction contact", Optics Express, vol. 24, No. 7, pp. 7816-7822, Apr. 2016.
Young, Lee W., Authorized officer, International Searching Authority, Written Opinion of the International Searching Authority, International Patent Application Serial No. PCT/US06/47448, completion date: Oct. 30, 2008.
Young, Lee W., Authorized officer, International Searching Authority, International Search Report, International Patent Application Serial No. PCT/US06/47448, search date: Nov. 1, 2008.
Robin K. Huang, Bien Chann, James Burgess, Michael Kaiman, Robert Overman, John D. Glenn, and Parviz Tayebati "Direct diode lasers with comparable beam quality to fiber, CO2, and solid state lasers", Proc. SPIE 8241, High-Power Diode Laser Technology and Applications X, 824102 (Feb. 8, 2012); https://doi.org/10.1117/12.907161 (abstract only).
International Preliminary Report on Patentability issued in International Application Serial No. PCT/US2019/046410, dated Feb. 16, 2021, 6 pages.
Watson, Edward, Walter Whitaker, Christopher Brewer, and Scott Harris "Implementing Optical Phased Array Beam Steering with Cascaded Mircrolens Arrays" IEEE Proceedings Aerospace Conference; Mar. 9-16, 2002 (Year: 2002).

\* cited by examiner

200

A MCPCB is provided, wherein the MCPCB has: a rigid, metal heat sink layer; at least one electrically conductive top layer; at least one electrically insulating dielectric layer positioned between the conductive top layer and the rigid, metal heat sink, wherein the dielectric layer has a thickness of less than 0.007 inches.
202

A voltage is applied to the at least one copper trace of the MCPCB, thereby generating an ultra-narrow, high-current pulse.
204

FIG. 5

USE OF METAL-CORE PRINTED CIRCUIT BOARD (PCB) FOR GENERATION OF ULTRA-NARROW, HIGH-CURRENT PULSE DRIVER

CROSS REFERENCE TO RELATED APPLICATION

This application claims benefit from the U.S. Provisional Application Ser. No. 62/718,249, filed Aug. 13, 2018, the contents of which are incorporated herein in its entirety, by reference.

FIELD OF THE DISCLOSURE

The present disclosure is generally related to PCBs and more particularly is related to the use of metal-core PCBs for constructing electrical current driver circuits capable of generating high-current pulses with ultra-narrow temporal pulse widths.

BACKGROUND OF THE DISCLOSURE

The Gallium Nitride (GaN) Metal-Oxide Field-Effect Transistor (MOSFET) boasts much higher electron mobility than its Silicon predecessor. This allows it to switch electrical currents at faster rates and reduces losses associated with being in the highly resistive "transitional" state between completely open and completely closed. Recent commercialization of these devices into high-efficiency power converters and other electric devices has resulted in their widespread availability and affordability. The GaN MOSFET effectively removed switching speed as a limitation to generating ultra-narrow, high-current pulses.

The other factors limiting the peak currents achievable in an ultra-narrow pulse period are the inductance of the high-current loop circuit and the voltage applied across the circuit. This relationship between current ramp rate, voltage and inductance are given by the following equation:

$$\frac{dI}{dt} = \frac{V_L}{L}$$

Where, $\frac{dI}{dt}$ is the rate of current rise in a closed-loop circuit;
$V_L$ is the voltage applied differentially across a closed-loop circuit; and
L is the series inductance of a closed-loop circuit.

There are often other design constraints limiting the voltage which can be applied to the closed-loop circuit so for clarity it is assumed that the applied voltage level is a fixed value such that the driver current ramp rate can only be increased by decreasing the closed-loop circuit inductance.

For an electrical current driver of this type, closed-loop circuit inductance is not a component that is intentionally included. Rather it is a composite of all of the parasitic inductances of the PCB and all of the electrical components (examples: resistors, capacitors, MOSFETs, lasers, lamps etc.) that may lie within the high-current path.

A well-known technique for reducing the circuit inductance is to use multiple circuit elements in parallel. For example rather than using a single capacitor with a value of 1 µF one could use ten capacitors with a value 0.1 µF could be used in parallel. This approach would result in $\frac{1}{10}^{th}$ of the inductance in the capacitor element with effectively no change in the equivalent capacitance. The costs associated with this design approach include the need for physically larger and more costly PCB assemblies. The requirement of physically larger PCB assemblies provides challenges to the design and manufacture of modern day products which generally have very strict size constraints due to the smaller size of the product. Similarly, the increased cost of the PCB assembly runs counter to the need to maintain lower price points in products.

The single biggest contributor to parasitic circuit inductance is usually the PCB itself. The inductance of the PCB traces can be approximated by the following formula:

$$L = 0.4 * \pi * \mu_r * \left(\frac{d}{w}\right) (\text{in } \mu\text{H per meter})$$

Where,
L is the mutual inductance of the PCB traces;
$\mu_r$ is the dielectric constant (aka relative permeability) of the dielectric material;
d is the separation of the two conductor places; and
w is the width of the two conductor planes.

For this reason, it is common to design the PCB with broad traces (often solid copper planes) and minimize the dielectric thickness between supply current trace and return current trace. The cost of widening the PCB traces is once again a physically larger and more expensive PCB, while the cost of reducing dielectric thickness is primarily reduced structural integrity and reliability. For example, a common dielectric material in PCB fabrication is FR-4 fiberglass. This material provides cost-effective electrical insulation as well as structural integrity to PCBs, but can bow or flex significantly under mechanical stress if not constructed with sufficient dielectric thickness. Many manufacturers will limit the thickness of the dielectric layers based on these material properties.

Thus, a heretofore unaddressed need exists in the industry to address the aforementioned deficiencies and inadequacies.

SUMMARY OF THE DISCLOSURE

Embodiments of the present disclosure provide a metal-core printed circuit board (MCPCB) apparatus to generate an ultra-narrow, high current pulse. Briefly described, in architecture, one embodiment of the system, among others, can be implemented as follows. The MCPCB apparatus includes a rigid, metal heat sink layer and at least one electrically conductive top layer. At least one electrically insulating dielectric layer is positioned between the conductive top layer and rigid, metal heat sink layer, wherein the dielectric layer has a thickness of less than 0.007 inches.

In one aspect of this disclosure, the MCPCB is free from additional heat sinking components, including heat sinks, thermal pads, greases, and clips.

In another aspect of this disclosure, the MCPCB driver circuit is capable of driving peak currents of greater than 50A in a full-wave half-maximum (FWHM) pulse width of less than 10 ns.

In another aspect of this disclosure, the MCPCB is free from additional conductive layers positioned between the top conductive layer and the rigid, metal heat sink layer.

In yet another aspect of this disclosure, the at least one copper trace further comprises a top conductive layer and a bottom conductive layer, wherein the at least one dielectric layer is positioned between the top and bottom layers.

In this aspect of the disclosure, a polymer dielectric layer is positioned between the bottom layer and the rigid, metal heat sink.

In another aspect of this disclosure, the at least one dielectric layer further comprises at least one of a plurality of dielectric polymers having a lower dielectric constant ($\mu_r$) than FR-4.

In another aspect of this disclosure, the at least one dielectric layer has a thickness of between 0.002 inches to 0.001 inches.

In another aspect of this disclosure, the at least one dielectric layer has a thickness of less than 0.001 inches.

In another aspect of this disclosure, the MCPCB is used in at least one of: a LIDAR source, or a laser illumination source.

The present disclosure can also be viewed as providing methods of building an electrical current driver capable of generating an ultra-narrow, high-current pulses using a metal-core printed circuit board (MCPCB). In this regard, one embodiment of such a method, among others, can be broadly summarized by the following steps: providing the MCPCB having: a rigid, metal heat sink layer; at least one electrically conductive top layer, at least one electrically insulating dielectric layer positioned between the conductive top layer and the rigid, metal heat sink, wherein the dielectric layer has a thickness of less than 0.007 inches. Applying a voltage to the at least one copper trace of the MCPCB, thereby generating an ultra-narrow, high-current pulse.

In one aspect of this disclosure, the MCPCB is free from additional heat sinking components, including heat sinks, thermal pads, greases, and clips.

In another aspect of this disclosure, the MCPCB driver circuit is capable of driving peak currents of greater than 50A in a full-wave half-maximum (FWHM) pulse width of less than 10 ns.

In another aspect of this disclosure, the MCPCB is free from additional conductive layers positioned between the top conductive layer and the rigid, metal heat sink layer.

In yet another aspect of this disclosure, the at least one copper trace further comprises a top conductive layer and a bottom conductive layer, wherein the at least one dielectric layer is positioned between the top and bottom layers.

In this aspect of the disclosure, a polymer dielectric layer is positioned between the bottom layer and the rigid, metal heat sink.

In another aspect of this disclosure, the at least one dielectric layer further comprises at least one of a plurality of dielectric polymers having a lower dielectric constant ($\mu_r$) than FR-4.

In another aspect of this disclosure, the at least one dielectric layer has a thickness of between 0.002 inches to 0.001 inches.

In another aspect of this disclosure, the at least one dielectric layer has a thickness of less than 0.001 inches.

In another aspect of this disclosure, the MCPCB is used in at least one of: a LIDAR source, or a laser illumination source.

In another aspect of this disclosure, a resulting peak current is greater than 50 amperes peak and a full-wave half-maximum (FWHM) current pulse width is less than 10 nanoseconds.

The present disclosure can also be viewed as providing an electrically-activated product. Briefly described, in architecture, one embodiment of the electrically-activated product, among others, can be implemented as follows. The electrically-activated product has a power source. A metal-core printed circuit board (MCPCB) has: a rigid, metal heat sink; at least one electrically conductive layer top layer, at least one electrically insulating dielectric layer positioned between the conductive top layer and the rigid, metal heat sink, wherein the dielectric layer has a thickness of less than 0.007 inches, and wherein, in response to an applied voltage from the power source, the MCPCB generates an ultra-narrow, high current pulse.

In one aspect of this disclosure, the dielectric layer further comprises at least one of a plurality of dielectric polymers having a lower dielectric constant (Pr) than FR-4.

In another aspect of this disclosure, the dielectric layer has a thickness of between 0.005 inches and 0.001 inches.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5 is a flowchart illustrating a method of generating an ultra-narrow, high-current pulse driver with a MCPCB, in accordance with the first exemplary embodiment of the present disclosure.

DETAILED DESCRIPTION

The present disclosure relates to a method of designing and fabricating printed circuit boards (PCBs) for products which must generate high-current pulses with ultra-narrow temporal widths. In accordance with this disclosure, a high-current pulse is generally characterized as a pulse with a greater than 50 amperes peak and an ultra-narrow temporal width is generally characterized as less than 10 nanoseconds. Electrical current pulses of this type are generally Gaussian in shape and are therefore defined by their full-wave at half maximum (FWHM) pulse width.

Figure 1:
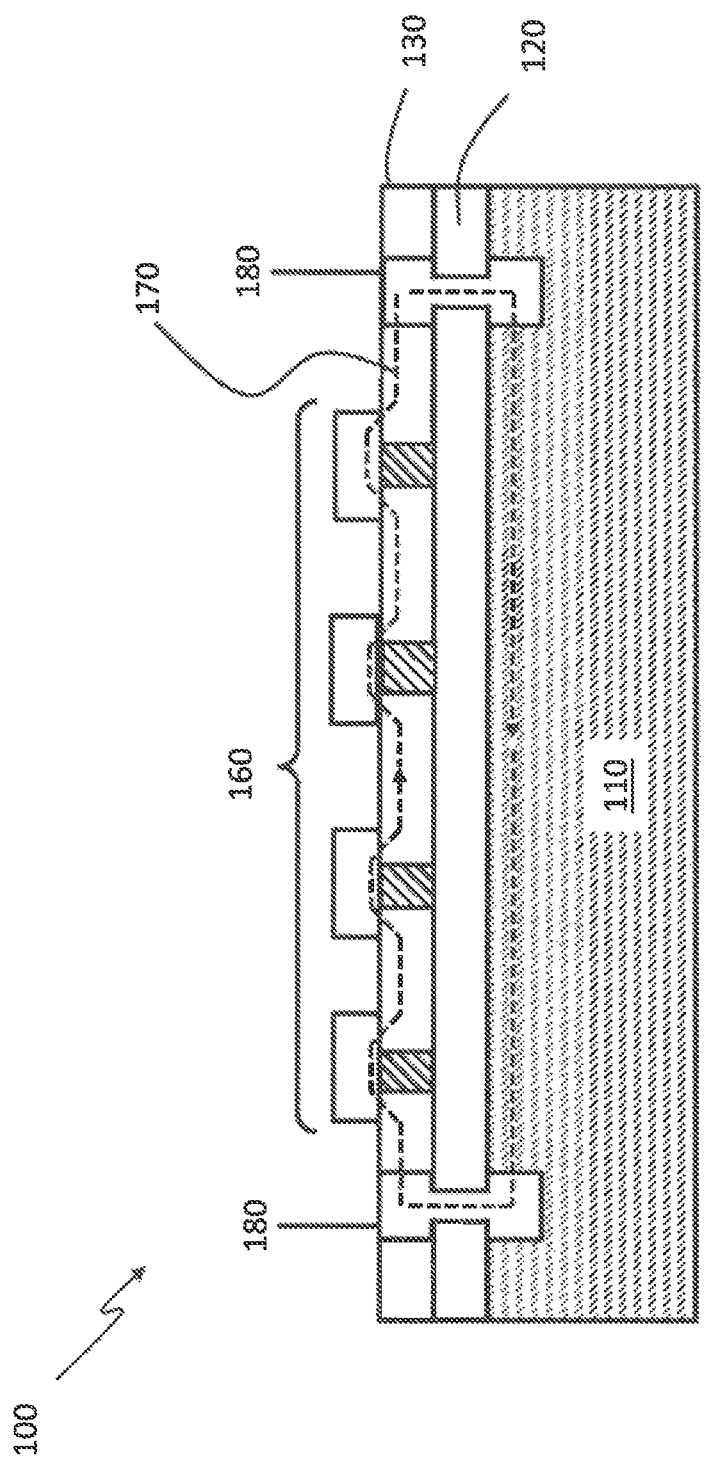
FIG. 1 is a cross-sectional illustration of a MCPCB, in accordance with a first exemplary embodiment of the present disclosure.

More specifically, the present disclosure includes the use of Metal-Core Printed Circuit Boards (MCPCB) in ultra-narrow, high-current pulse generation. FIG. 1 is a cross-sectional illustration of a MCPCB 100, in accordance with a first exemplary embodiment of the present disclosure. As shown, the MCPCB 100 includes a rigid, metal heat sink 110, which may be formed from copper, aluminum, or other known heat sink materials. A dielectric layer 120 is positioned directly in contact with the rigid, metal heat sink 110. This dielectric layer 120 is electrically insulating and may be formed from a polymer. The electrically conductive top layer 130 contains at least one conductive trace as well circuit components and is positioned at least partially over the dielectric layer 120. The dielectric layer 120 has a thickness of less than 0.007 inches.

The dielectric layer 120, or dielectric layers, is bonded directly to the rigid, metal heat sink 110, with the conductive top layer 130 or copper layer bonded on the dielectric layer 120. Various circuitry components 160 are positioned in electrical communication with the conductive top layer 130 such that a high current path 170 can be formed between the circuitry components 160, through one or more vias 180 positioned between the conductive top layer 130, through the dielectric layer 120 and to the rigid, metal heat sink 110. The MCPCB 100 of FIG. 1 is used in applications where the heat sink 110 does not require electrical isolation from the current.

Figure 2:
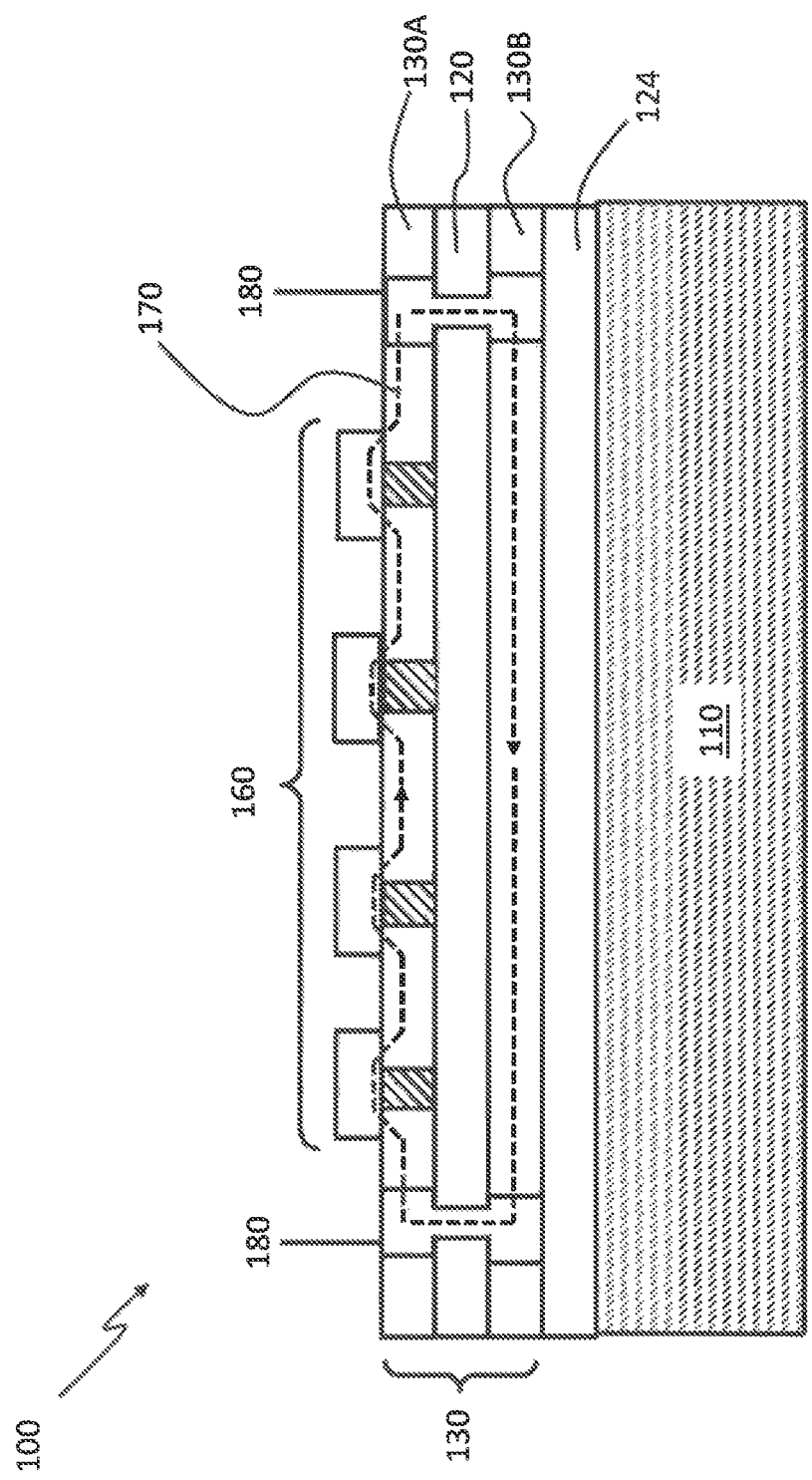
FIG. 2 is a cross-sectional illustration of a MCPCB, in accordance with the first exemplary embodiment of the present disclosure.

FIG. 2 is a cross-sectional illustration of a MCPCB, in accordance with the first exemplary embodiment of the present disclosure. In particular, FIG. 2 illustrates the MCPCB 100 for use in an application where the heat sink 110 requires electrical isolation from the circuit. As shown, the MCPCB 100 includes a rigid, metal heat sink 110, which may be formed from copper, aluminum, or other known heat sink materials. A polymer dielectric layer 124 or pre-preg polymer dialectic layer, or multiple layers thereof, is positioned in contact with the heat sink 110. One or more polymer dielectric layers 124 are formed from a polymer dielectric material. Next, the dielectric layer 120 is positioned between the conductive top layer 130 which is formed from a conductive top layer 130A and a conductive bottom layer 130B. This dielectric layer 120 is a core layer which may be formed from a polymer dielectric material. The top layer 130A of the electrically conductive top layer 130 is positioned at least partially over the dielectric layer 120, whereas the bottom layer 130B is positioned below the dielectric layer 120. The dielectric layer 120 has a thickness of less than 0.007 inches.

The dielectric layer 120 is positioned between the top and bottom layers 130A, 130B and the overall structure is separated from the metal heat sink with the polymer dielectric layer 124. In this structure, various circuitry components 160 can be positioned in electrical communication with the top layer 130A such that a high current path 170 can be formed between the circuitry components 160, through one or more vias 180 positioned between the top layer 130A of the electrically conductive top layer 130, through the dielectric layer 120 and to the bottom layer 130B of the electrically conductive top layer 130. The heat sink 110 remains in electrical isolation from the current through the polymer dielectric layer 124, which allows the MCPCB 100 of FIG. 2 to be used in applications where the heat sink 110 does require electrical isolation from the current.

The resulting structure of the MCPCBs in FIGS. 1-2 is one where the dielectric layer 120 can be made thinner than conventional dielectric layers while reducing the inductance of the PCB traces. This benefit is due to the fact that the single biggest contributor to parasitic circuit inductance is usually the PCB itself. Specifically, the mutual inductance of PCB traces can be calculated based on a function of the dielectric constant of the dielectric layer 120 and the difference between the separation distance of the two conductor planes and the width of the conductor planes. Minimizing the dielectric thickness between supply current trace and return current trace will reduce the parasitic circuit inductance, but doing so will leave the PCB less structurally rigid and durable than is optimal. As a result, conventionally, there are minimal requirements for the thickness of the dielectric layer. However, the subject disclosure is able to use a dielectric layer 120 that is far thinner than conventional layers. This is due to the fact that the rigid, metal heat sink layer 110 provides the necessary rigidity and support to the PCB, thus allowing the dielectric layer 120 to be thinned to significantly reduce the parasitic circuit inductance. The end product is a MCPCB 100 which has superior operating characteristics to conventional MCPCBs without increasing the overall size of the PCB or the cost of manufacture.

It is noted that in addition to the MCPCB dielectric layer 120 being much reduced in height, a high-current driver is also able to operate at relatively high average power levels without the additional use of subsequent heat sinking components, such as external heat sinks, thermal pads, greases, and clips. Referring to FIG. 1, the conductive top layer 130, or in reference to FIG. 2, the conductive top and bottom layers 130A, 130B, may further include a copper layer formed as a solid copper plane or formed as a structure with one or more planar surfaces.

The dielectric layer 120 of the MCPCB 100 may include a variety of different materials. In one example, the dielectric layer 120 is formed from at least one of a plurality of dielectric polymers having a lower dielectric constant ($\mu_r$) than FR-4. As is known in the art, FR-4 is a National Electrical Manufacturers Association (NEMA) grade designation for glass-reinforced epoxy laminate material. FR-4 is a composite material composed of woven fiberglass cloth with an epoxy resin binder and is commonly used as an electrical insulator possessing considerable mechanical strength. The material is known to retain its high mechanical values and electrical insulating qualities, and therefore it is used in a wide variety of electrical and mechanical applications, including as dielectric layers in PCBs.

The thickness of conventional dielectric layers is commonly required to be at least 0.007 inches. In the subject disclosure, the thickness of the dielectric layer 120 is less than 0.007 inches. In one example, the dielectric layer 120 has a thickness of between 0.006 inches to 0.002 inches. In another example, the dielectric layer 120 has a thickness of between 0.002 inches and 0.001 inches. In another example, the dielectric layer 120 has a thickness of less than 0.001 inches. In other examples, the dielectric layer 120 may have other thicknesses less than 0.007 inches, as may vary depending on design and application of the MCPCB.

Figure 3:
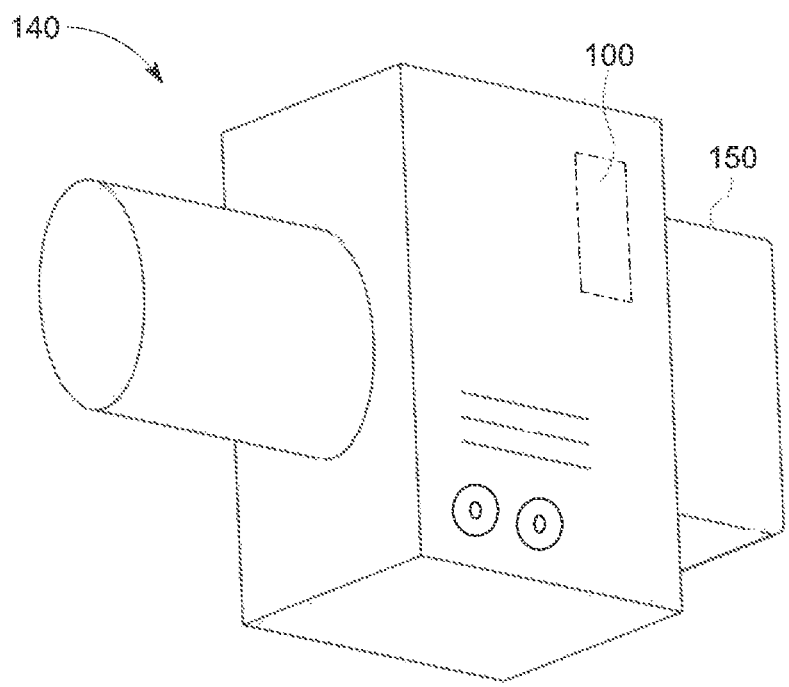
FIG. 3 is an illustration of an electronically-activated product having the MCPCB, in accordance with the first exemplary embodiment of the present disclosure.

The MCPCB 100 may be incorporated and used within a variety of electronic and electronically-activated products. FIG. 3 is an illustration of an electronically-activated product 140 having the MCPCB 100, in accordance with the first exemplary embodiment of the present disclosure. As shown in FIG. 3, the electronically-activated product 140 includes the MCPCB 100 therein or otherwise in electrical communication therewith. Additionally, the electronically-activated product 140 may include an internal power source 150; however external power sources may also be used. The electronically-activated product 140 may include an imaging device, such as a LIDAR source, a gated imaging device, or a 3D sensing device, among other imaging devices. Additionally, the electronically-activated product 140 may be a pulsed optical illumination source, such as with beacon lights or range finding devices, or any other electronic product with a PCB, all of which are considered within the scope of the present disclosure.

It is noted that MCPCBs have been used for electronics as a thermal management technique, especially for LED lighting applications. The MCPCB provides effective heat sinking for high power-dissipating components without the use of additional heat sinks, thermal pads, greases, clips, etc. However, the application of the MCPCB to increase electrical performance, as taught in the subject disclosure, is not known in the art. Indeed, the application of the MCPCB to increase electrical performance as specified herein takes advantage of the MCPCB construction to dramatically reduce the inductance of the PCB traces by utilizing the relatively thick heat sink layer on which the MCPCB is constructed. This heat sink is inherently rigid and therefore, it can provide the necessary structural support to the MCPCB without a conventionally thick dielectric layer. This allows a reduction of the dielectric layer thickness (d) without compromising the structural integrity of the MCPCB. Many polymers are commercially available with thickness of only 0.0013 inches, for example. Additionally, the since MCPCB does not depend on the dielectric layers for rigidity, it can be constructed using a variety of dielectric materials. Special polymers can be used which have lower dielectric constant ($\mu_r$) than FR-4 so that trace inductance is reduced even further.

Figure 4:
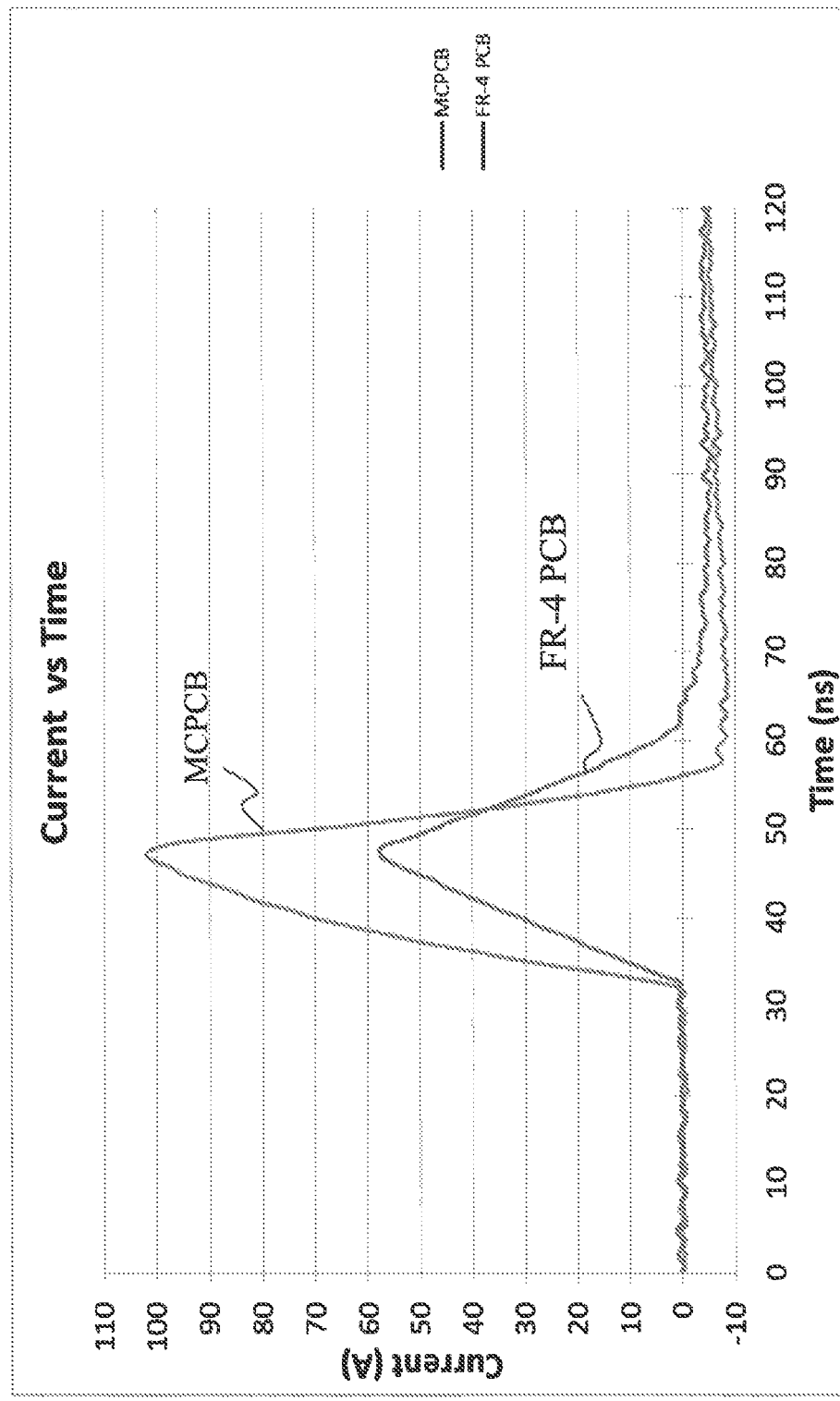
FIG. 4 is a graph illustrating a test of the MCPCB, in accordance with the first exemplary embodiment of the present disclosure.

FIG. 4 is a graph illustrating a test of the MCPCB, in accordance with the first exemplary embodiment of the present disclosure. In particular, the graph of FIG. 4 illustrates a test comparison between a conventional PCB assembly and a MCPCB constructed in accordance with this disclosure. The two PCB assemblies were constructed; one using the common FR-4 dielectric having a thickness of 0.007 inches as a dielectric layer and the other using a MCPCB with a Sekisui KNDJ002 having a thickness of 0.003 inches as a dielectric layer. Both PCBs were assembled using the same circuit components and tested using the same test stimulus. FWHM pulse width was measured in both cases and came to 15±0.5 nanoseconds. As shown in FIG. 4, in the noted time period, the resulting peak current of the MCPCB reached over 100 amperes while the conventional PCB reached short of 60 amperes. Thus, the MCPCB was 76% higher over the conventional PCB, which illustrates the dramatic performance improvement of the MCPCB of the subject disclosure over conventional PCBs.

FIG. 5 is a flowchart 200 illustrating a method of generating an ultra-narrow, high-current pulse driver with a MCPCB, in accordance with the first exemplary embodiment of the present disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 202, a MCPCB is provided, wherein the MCPCB has: a rigid, metal heat sink layer; at least one electrically conductive top layer, at least one electrically insulating dielectric layer positioned between the conductive top layer and the rigid, metal heat sink, wherein the dielectric layer has a thickness of less than 0.007 inches. A voltage is applied to the at least one copper trace of the MCPCB, thereby generating an ultra-narrow, high-current pulse (block 204). The method may include any number of additional steps, features, and functions, including any disclosed within the present description.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A metal-core printed circuit board (MCPCB) apparatus comprising:
   a rigid, metal heat sink layer;
   at least one electrically conductive top layer having at least one conductive trace and at least one via not extending above the at least one electrically conductive top layer, wherein a thickness of the rigid, metal heat sink layer is greater than a thickness of the at least one electrically conductive top layer;
   at least one electrically insulating dielectric layer positioned between the electrically conductive top layer and the rigid, metal heat sink layer and extending fully across a top surface of the rigid, metal heat sink layer, wherein the electrically insulating dielectric layer has a thickness of less than 0.007 inches and a lower dielectric constant ($\mu_r$) than FR-4, and wherein the thickness of the electrically insulating dielectric layer is constant across the rigid, metal heat sink layer; and
   a switching element mounted above the at least one electrically insulating dielectric layer, wherein the switching element comprises a high-current, ultra-narrow driver circuit of a GaN (Gallium Nitride) MOSFET (Metal-Oxide Semiconductor Field-Effect Transistor) type;
   wherein the MCPCB is free from additional heat sinks, thermal pads, greases, or clips.

2. The apparatus of claim 1, wherein the high-current, ultra-narrow driver circuit is capable of driving peak currents of greater than 50A in a full-wave half-maximum (FWHM) pulse width of less than 10 ns.

3. The apparatus of claim 1, wherein the at least one conductive trace further comprises a top conductive layer and a bottom conductive layer, wherein the at least one electrically insulating dielectric layer is positioned between the top conductive layer and the bottom conductive layer, and wherein a polymer dielectric layer is positioned between the bottom conductive layer and the rigid, metal heat sink.

4. The apparatus of claim 1, wherein the at least one electrically insulating dielectric layer has a thickness of between 0.006 inches and 0.002 inches, or between 0.005 inches and 0.001 inches, or between 0.002 inches and 0.001 inches, or less than 0.001 inches.

5. The apparatus of claim 1, wherein the MCPCB is used in at least one of: a LIDAR source, or a laser illumination source.

6. A method of generating an ultra-narrow, high-curve t pulse driver with a metal-core printed circuit board (MCPCB), the method comprising:
provoking the MCPCB having:
a rigid, metal heat sink layer;
at least one electrically conductive top layer having at least one conductive trace and at least one via not extending above the at east one electrically conductive top layer, wherein a thickness of the rigid, metal heat sink layer is greater than a thickness of the at least one electrically conductive top layer;
at least one electrically insulating dielectric layer positioned between the electrically conductive top layer and the rigid, metal heat sink layer and extending fully across a top surface of the rigid, metal heat sink layer, wherein the electrically insulating dielectric layer has a thickness of less than 0.007 inches and a lower dielectric constant ($\mu_r$) than FR-4, and wherein the thickness of the electrically insulating dielectric layer is constant across the rigid, metal heat sink layer; and
a switching element mounted above the at least one electrically insulating dielectric layer, wherein the switching element comprises a high-circuit, ultra-narrow drives circuit of a GaN (Gallium Nitride) MOSFET (Metal-Oxide Semiconductor Field-Effect Transistor) type;
wherein the MCPCB is free from additional heat sinks, thermal pads, greases, or clips; and
applying a voltage to the at least one conductive trace of the MCPCB, thereby generating an ultra-narrow, high-current pulse.

7. The method of claim 6, wherein the high-current, ultra-narrow driver circuit is capable of driving peak currents of greater than 50A in a full-wave half-maximum (FWHM) pulse width of less than 10 ns.

8. The method of claim 6, wherein the at least one copper trace farther comprises a top conductive layer and a bottom conductive layer, wherein the at least one electrically insulating dielectric layer is positioned between the top and bottom conductive layers, and wherein a polymer dielectric layer is positioned between the bottom conductive layer and the rigid, metal heat sink.

9. The method of claim 6, wherein the at least one electrically insulating dielectric layer has a thickness of between 0.006 inches to 0.002 inches, or between 0.005 inches and 0.001 inches, or between 0.002 inches and 0.001 inches, or less than 0.001 inches.

10. The method of claim 6, wherein the MCPCB is used in at least one of: a LIDAR source, or a laser illumination source.

11. The method of claim 6, wherein a resulting peak current is greater than 50 amperes peak and a full-wave half-maximum (FWHM) current pulse width is less than 10 nanoseconds.

12. An electrically-activated product comprising:
a power source;
a metal-core printed circuit board (MCPCB) having:
a rigid, metal heat sink;
at least one electrically conductive layer top layer and at least one via not extending above the at least one electrically conductive top layer, wherein a thickness of the rigid, metal heat sink layer is greater than a thickness of the at least one electrically conductive top layer;
at least one electrically insulating dielectric layer positioned between the electrically conductive top layer and the rigid, metal heat sink layer and extending fully across a top surface of the rigid, metal heat sink layer, wherein the electrically insulating dielectric layer has a thickness of less than 0.007 inches and a lower dielectric constant ($\mu_r$) than FR-4, and wherein the thickness of the electrically insulating dielectric layer is constant across the rigid, metal heat sink layer; and
a switching element mounted above the at least one electrically insulating dielectric layer, wherein the switching element comprises high-current, ultra-narrow driver circuit of a GaN (Gallium Nitride) MOSFET (Metal-Oxide Semiconductor Field-Effect Transistor) type;
wherein the MCPCB is free from additional heat sinks, thermal pads, greases, or clips; and
wherein, in response to an applied voltage from the power source, the MCPCB generates an ultra-narrow, high current pulse.

13. The electrically-activated product of claim 12, wherein the at least one electrically insulating dielectric layer has a thickness of between 0.006 inches and 0.002 inches, or 0.005 inches and 0.001 inches, or between 0.002 inches and 0.001 inches, or less than 0.001 inches.

* * * * *